US009920993B2

(12) United States Patent
Hashimoto et al.

(10) Patent No.: US 9,920,993 B2
(45) Date of Patent: Mar. 20, 2018

(54) HEAT TREATMENT METHOD AND HEAT TREATMENT APPARATUS FOR HEATING SUBSTRATE BY IRRADIATING SUBSTRATE WITH LIGHT

(75) Inventors: Kazuyuki Hashimoto, Kyoto (JP); Tatsufumi Kusuda, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 377 days.

(21) Appl. No.: 13/468,381

(22) Filed: May 10, 2012

(65) Prior Publication Data
US 2012/0288261 A1    Nov. 15, 2012

(30) Foreign Application Priority Data

May 13, 2011    (JP) .................................. 2011-107895

(51) Int. Cl.
*A21B 2/00*    (2006.01)
*F26B 3/30*    (2006.01)
(Continued)

(52) U.S. Cl.
CPC ........ *F27B 17/0025* (2013.01); *F27D 5/0037* (2013.01); *H01L 21/67115* (2013.01); *H01L 21/67248* (2013.01)

(58) Field of Classification Search
CPC ..... H01L 21/67115; H01L 2924/13055; H01L 2924/00; F27B 17/0025; G01J 5/0007; G01J 5/026
(Continued)

(56) References Cited

U.S. PATENT DOCUMENTS 3,566,122 A * 2/1971 Paine et al. ................. 250/336.1
5,153,563 A * 10/1992 Goto ......................... G01J 5/60
                                                        236/49.2
(Continued)

FOREIGN PATENT DOCUMENTS

JP    2009-508337    2/2009
JP    2010-153847    7/2010

OTHER PUBLICATIONS

Japanese Office Action dated Jan. 20, 2015 in connection with Japanese Application No. 2011-107895 with English translation of relevant parts.
(Continued)

*Primary Examiner* — David Angwin
*Assistant Examiner* — Gyounghyun Bae
(74) *Attorney, Agent, or Firm* — Ostrolenk Faber LLP

(57) ABSTRACT

A photodetector element for receiving radiated light from a surface of a semiconductor wafer loses a detection function because the intensity of the received light exceeds a detection limit while a flash lamp emits light. Measurement is not performed during the above-mentioned period, and the intensity of the radiated light from the surface of the semiconductor wafer is measured after the flash lamp stops emitting light and the photodetector element restores the detection function. Then, the temperature of the surface of the semiconductor wafer heated by irradiation with a flash of light is calculated based on the measured intensity of the radiated light. Accordingly, even in a case where intense irradiation is performed in an extremely short period of time, such as flash irradiation, the flash of light does not act as ambient light, which enables to obtain the surface temperature of the semiconductor wafer.

2 Claims, 14 Drawing Sheets

(51) Int. Cl.

| | | |
|---|---|---|
| *F21V 7/00* | (2006.01) | |
| *H05B 3/60* | (2006.01) | |
| *G01N 25/02* | (2006.01) | |
| *G01K 17/00* | (2006.01) | |
| *G01J 5/00* | (2006.01) | |
| *F27B 5/14* | (2006.01) | |
| *A21B 1/00* | (2006.01) | |
| *F27B 17/00* | (2006.01) | |
| *F27D 5/00* | (2006.01) | |
| *H01L 21/67* | (2006.01) | |

(58) Field of Classification Search
USPC ......... 219/385, 390, 405, 411; 392/416, 418
See application file for complete search history.

(56) References Cited

U.S. PATENT DOCUMENTS

| | | | | |
|---|---|---|---|---|
| 5,412,465 | A * | 5/1995 | Baylor | G01N 21/314 110/186 |
| 5,501,637 | A * | 3/1996 | Duncan et al. | 374/126 |
| 5,830,277 | A * | 11/1998 | Johnsgard | C23C 16/481 118/666 |
| 6,859,616 | B2 * | 2/2005 | Kusuda et al. | 392/416 |
| 7,445,382 | B2 * | 11/2008 | Camm et al. | 374/121 |
| 7,616,872 | B2 * | 11/2009 | Camm et al. | 392/416 |
| 7,935,913 | B2 * | 5/2011 | Kusuda | 219/411 |
| 2005/0062388 | A1 * | 3/2005 | Camm et al. | 313/231.71 |
| 2005/0063453 | A1 * | 3/2005 | Camm et al. | 374/161 |
| 2005/0133167 | A1 * | 6/2005 | Camm et al. | 156/345.51 |
| 2006/0228897 | A1 * | 10/2006 | Timans | 438/758 |
| 2007/0069161 | A1 * | 3/2007 | Camm et al. | 250/504 R |
| 2009/0175605 | A1 * | 7/2009 | Kobayashi | 392/416 |
| 2009/0245761 | A1 * | 10/2009 | Nakajima | F27B 17/0025 392/416 |
| 2011/0227402 | A1 | 9/2011 | Takada et al. | |
| 2012/0288261 | A1 * | 11/2012 | Hashimoto et al. | 392/416 |
| 2012/0288970 | A1 * | 11/2012 | Hashimoto et al. | 438/16 |
| 2013/0203269 | A1 * | 8/2013 | Yokouchi | H01L 21/26 438/795 |

OTHER PUBLICATIONS

Dec. 8, 2015 Decision to Grant a Patent in corresponding Japanese application 2011-107895.

Japanese Office Action dated Jul. 7, 2015 in connection with Japanese Application No. 2011-107895 with English translation of relevant parts.

* cited by examiner

F I G . 6
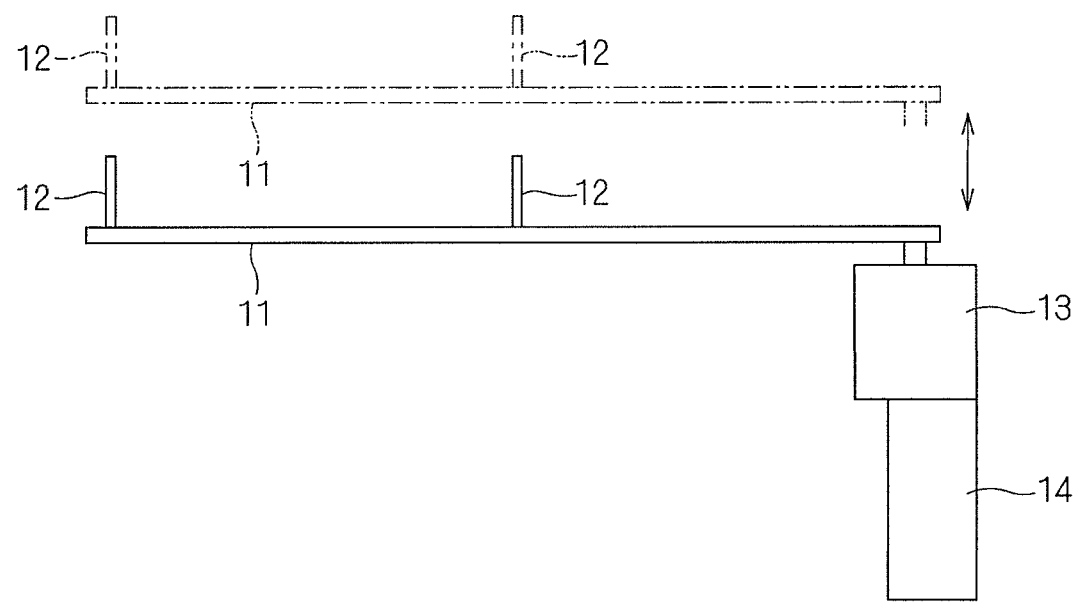

F I G. 7
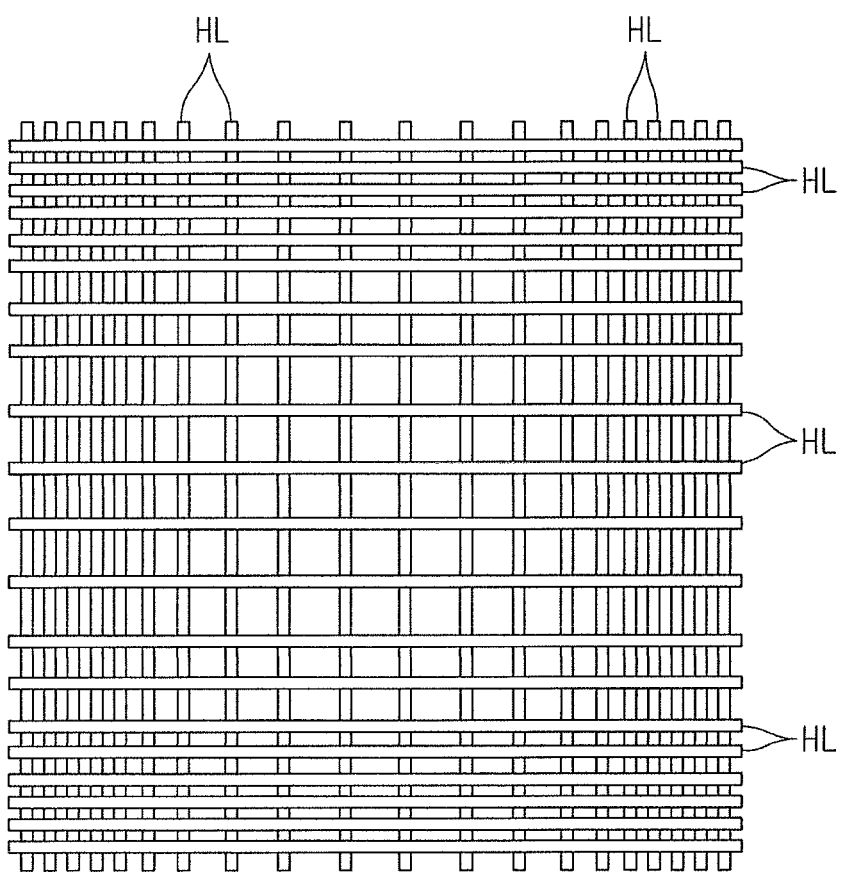

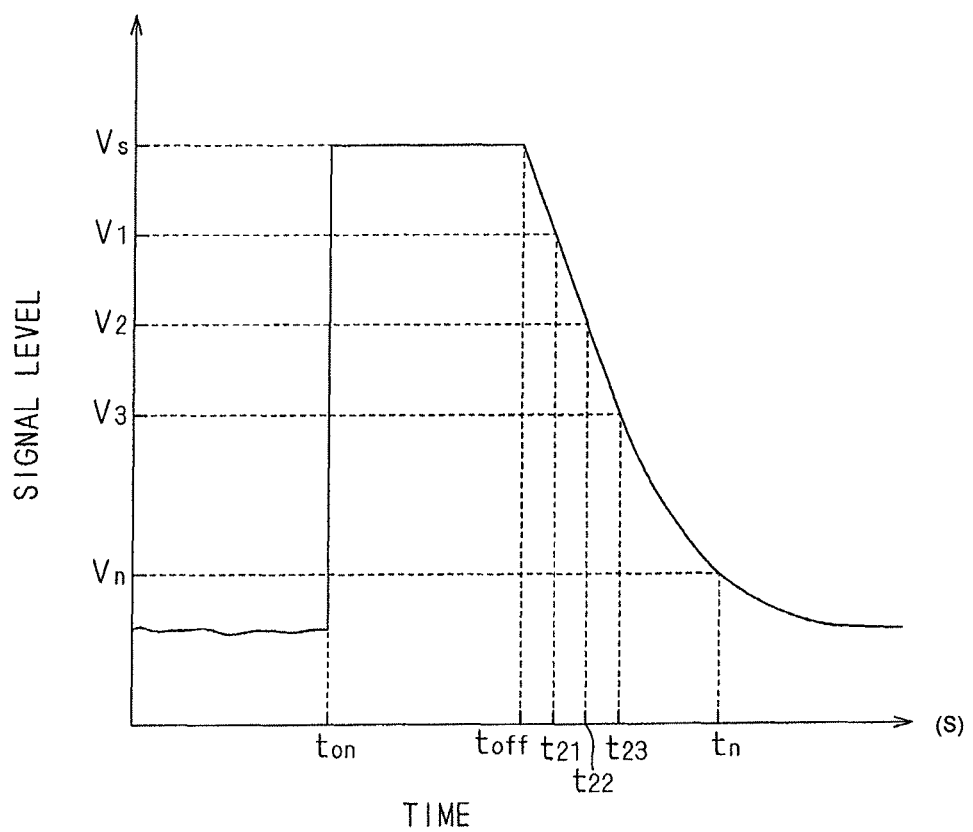
F I G . 1 2

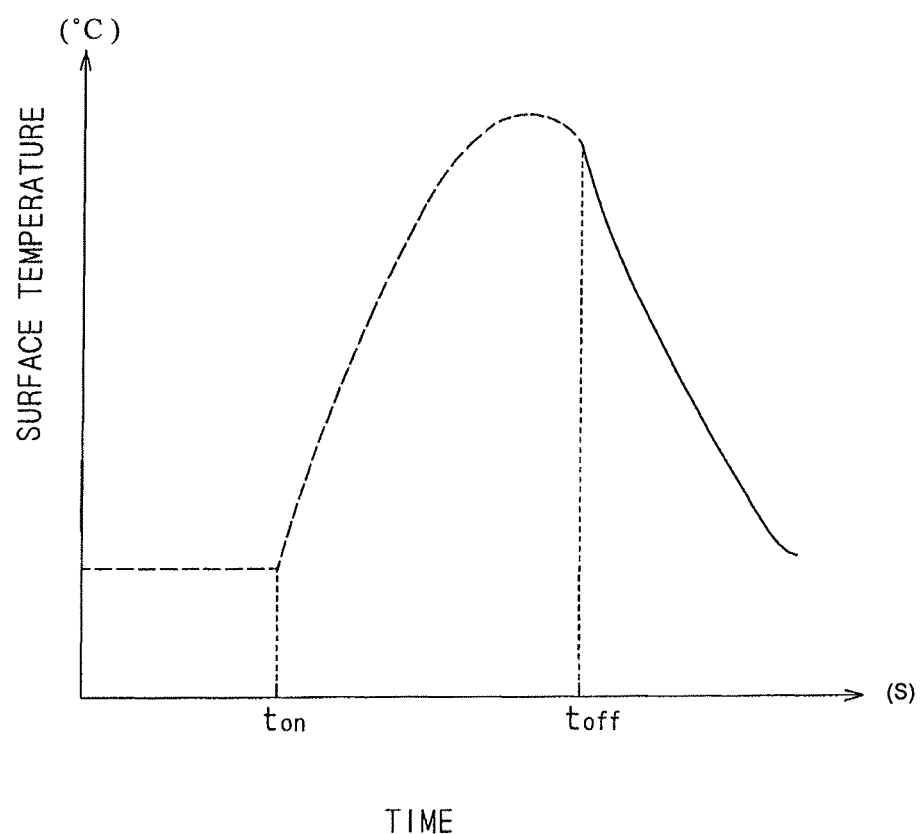
F I G . 1 4

HEAT TREATMENT METHOD AND HEAT TREATMENT APPARATUS FOR HEATING SUBSTRATE BY IRRADIATING SUBSTRATE WITH LIGHT

BACKGROUND OF THE INVENTION

Field of the Invention

The present invention relates to a heat treatment method and a heat treatment apparatus for heating a thin plate-like precision electronic substrate (hereinafter referred to simply as a "substrate") such as a semiconductor wafer and a glass substrate for a liquid crystal display device by irradiating the substrate with light.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short period of time. The flash lamp annealing is a heat treatment technique in which xenon flash lamps (the term "flash lamp" as used hereinafter refers to a "xenon flash lamp") are used to irradiate the surface of a semiconductor wafer with a flash of light, thereby raising the temperature of only the surface of the semiconductor wafer doped with impurities in an extremely short period of time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short period of time of several milliseconds or less allows a selective temperature rise only near the surface of the semiconductor wafer. Therefore, the temperature rise in an extremely short period of time with the xenon flash lamps allows only the activation of impurities to be achieved without deep diffusion of the impurities.

U.S. Pat. No. 7,935,913 discloses the technique in which a light measuring part including a calorimeter disposed outside a chamber body, a light guide structure for guiding the light emitted to the inside of the chamber body to the calorimeter, and a calculation part that performs computations based on an output from the calorimeter is provided in a flash lamp annealer, to thereby measure the energy of the light emitted to the inside of the chamber body from a flash lamp with the calorimeter. In addition, U.S. Pat. No. 7,935,913 discloses that the surface temperature of a substrate is obtained by computations based on the energy of a flash of light measured by the calorimeter.

In the technique disclosed in U.S. Pat. No. 7,935,913, the total energy (amount of heat) of single flash irradiation is measured, to thereby obtain the maximum attained temperature of the surface of the substrate from the total energy. However, even if the total energy of flash irradiation is constant, the light energy to be absorbed differs between different emissivities of a semiconductor wafer surface, which leads to variations in the surface temperature to be attained. Typically, a device pattern is formed on the surface of a semiconductor wafer W, and the emissivity differs depending on a pattern.

Therefore, it is conceivable to measure the surface temperature more directly by the measurement of the radiated light from the surface of the semiconductor wafer in flash irradiation. However, the intensity of a flash of light itself radiated from the flash lamp is extremely large, which makes it impossible to measure the intensity of the radiated light from the semiconductor wafer due to the unnecessarily large intensity of a background during light emission from the flash lamp. That is, in a case where heating by light emission is performed using a light source that emits light of large intensity in an extremely short period of time, such as a flash lamp, it is considerably difficult to calculate the surface temperature by measurement of the intensity of the light radiated from a semiconductor wafer.

SUMMARY OF THE INVENTION

The present invention is intended for a heat treatment apparatus that heats a substrate by irradiating the substrate with light.

According to one aspect of the present invention, the heat treatment apparatus comprises: a chamber for receiving a substrate therein; a holder for holding the substrate within the chamber; an irradiation part for irradiating a surface of the substrate held by the holder with light; a photodetector element provided on the surface side of the substrate held by the holder, for receiving radiated light from the surface; a radiated light intensity measuring part for measuring an intensity of the radiated light received by the photodetector element; and a temperature calculating part for calculating a temperature of the surface of the substrate heated by the irradiation based on the intensity of the radiated light from the surface of the substrate, the intensity being measured by the radiated light intensity measuring part after the irradiation part stops irradiation.

The temperature of the surface of the substrate heated by irradiation is calculated based on the intensity of the radiated light from the surface of the substrate that has been measured by the radiated light intensity measuring part after the irradiation part stops emitting light. Accordingly, even in a case where the irradiation part irradiates intense light in an extremely short period of time, the surface temperature of the substrate can be obtained without being affected by the intense radiation.

The present invention is also intended for a method of heating a substrate by irradiating the substrate with light.

According to one aspect of the present invention, the heat treatment method comprises the steps of: (a) irradiating a substrate with light; (b) measuring an intensity of radiated light from a surface of the substrate after the irradiation in the step (a) is stopped; and (c) calculating a temperature of the surface of the substrate heated in the step (a) based on the intensity of the radiated light from the surface of the substrate, the intensity being measured in the step (b).

The intensity of the radiated light from the surface of the substrate is measured after radiation is stopped, and then, the temperature of the surface of the substrate heated by the irradiation is calculated based on the intensity of the radiated light from the surface of the substrate that has been measured. Accordingly, even in a case where intense light is radiated in an extremely short period of time, the surface temperature of the substrate can be obtained without being affected by the intense radiation.

It is therefore an object of the present invention to obtain the surface temperature of a substrate even in a case where intense light is radiated in an extremely short period of time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a side view of the transfer mechanism;

FIG. 7 is a plan view showing an arrangement of halogen lamps;

FIG. 12 is a graph showing changes in the level of a signal outputted from a photodetector element to the sampling part;

FIG. 14 is another graph showing changes in the surface temperature of a semiconductor wafer by flash irradiation.

DESCRIPTION OF THE PREFERRED EMBODIMENT

A preferred embodiment according to the present invention will now be described in detail with reference to the drawings.

Figure 1:
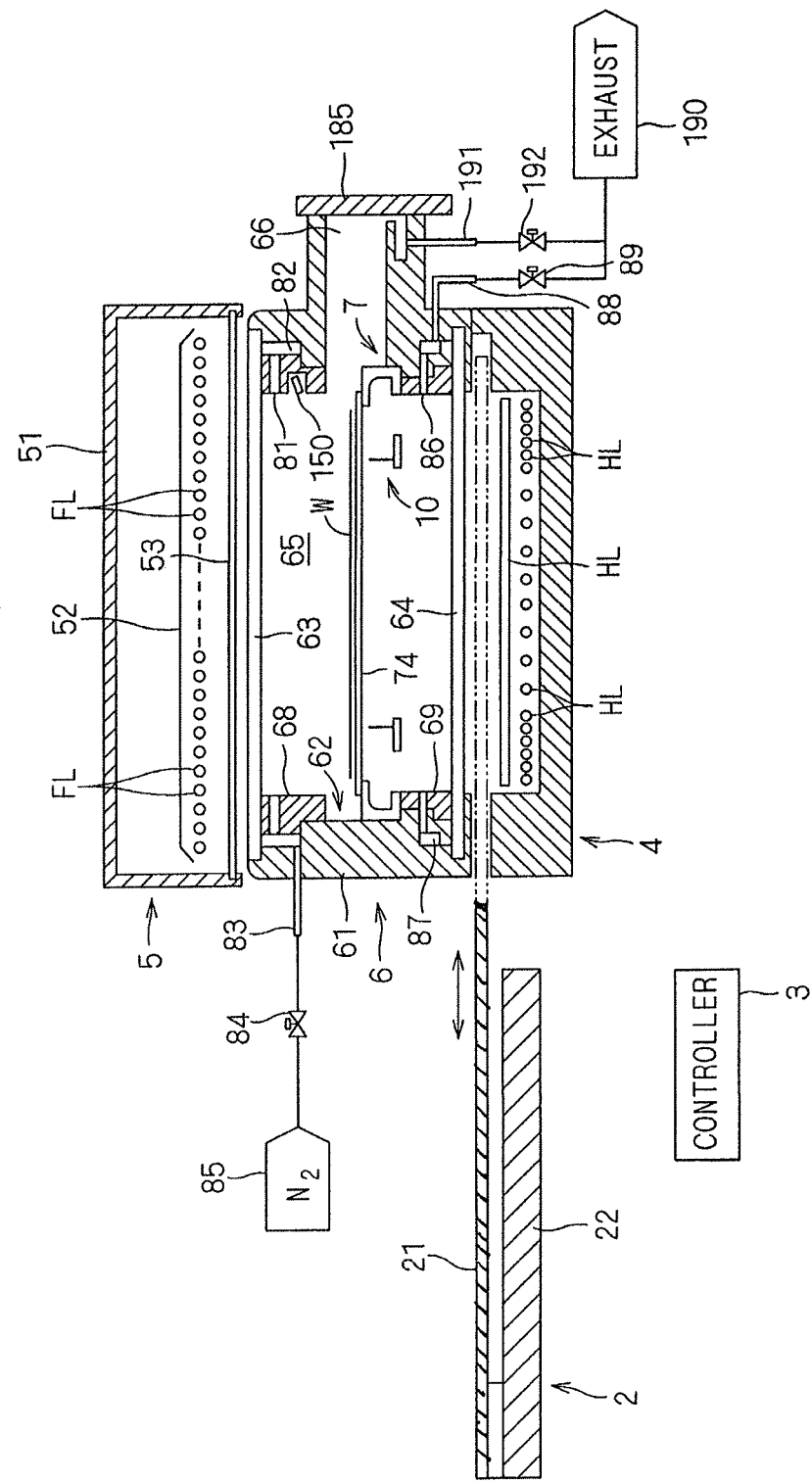
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to the preferred embodiment of the present invention is a flash lamp annealer for irradiating a disk-shaped semiconductor wafer W having a diameter of 300 mm and serving as a substrate with a flash of light to heat the semiconductor wafer W. The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal position, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws (not shown). In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 for holding a semiconductor wafer W.

The chamber side portion 61, and the upper and lower reflective rings 68 and 69 are made of a metal material (e.g., stainless steel) with high strength and high heat resistance.

The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into the heat treatment space 65 and to be transported out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Further, a photodetector element 150 for receiving the radiated light from the surface of a semiconductor wafer W is provided in the upper portion of the inner wall of the chamber 6. As shown in FIG. 1, the photodetector element 150 is provided above the holder 7, that is, on the front surface side of the semiconductor wafer W held by the holder 7. The photodetector element 150 is provided on the inner wall of the chamber 6 such that a distal end thereof is inclined toward the front surface of the semiconductor wafer W held by the holder 7, and may be provided in the upper reflective ring 69. While an InSb (indium antimonide) radiation thermometer capable of performing high-speed measurement is employed as the photodetector element 150 in this preferred embodiment, not limited thereto, an element having a high response speed such as a CCD or photodiode may be used.

Figure 2:
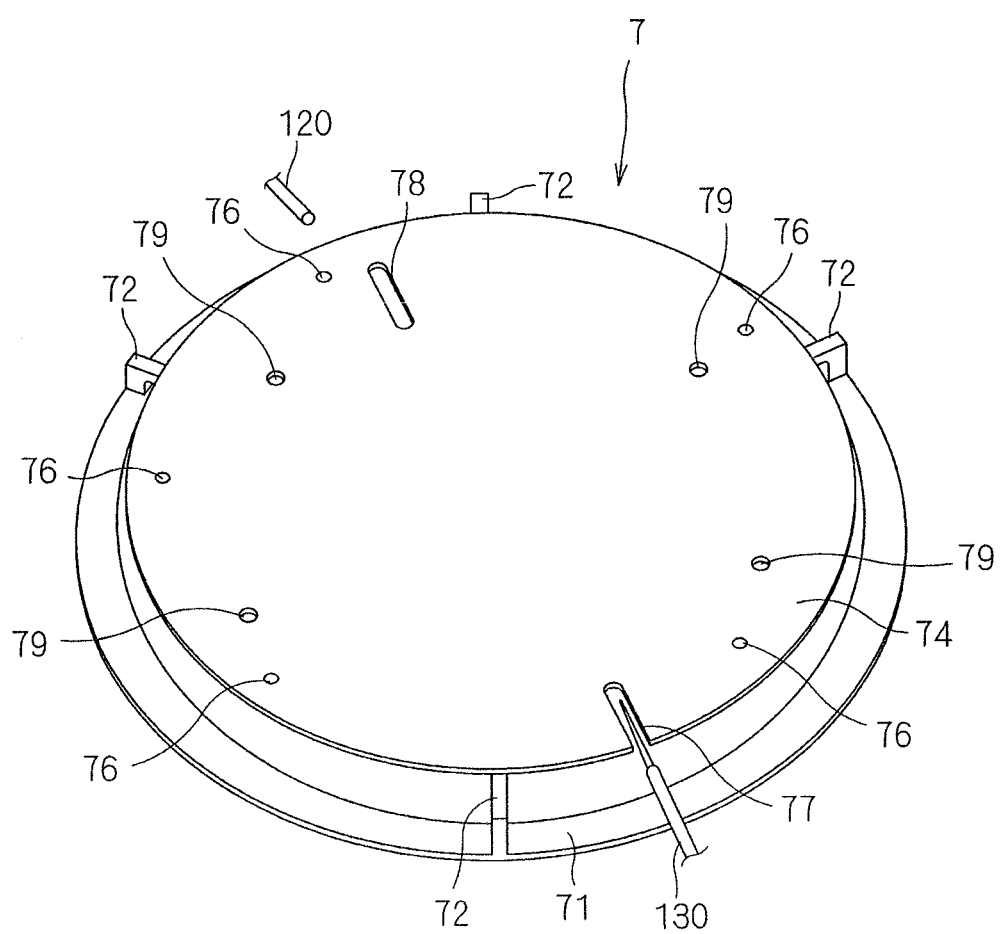
FIG. 2 is a perspective view showing the entire external appearance of a holder.
Figure 3:
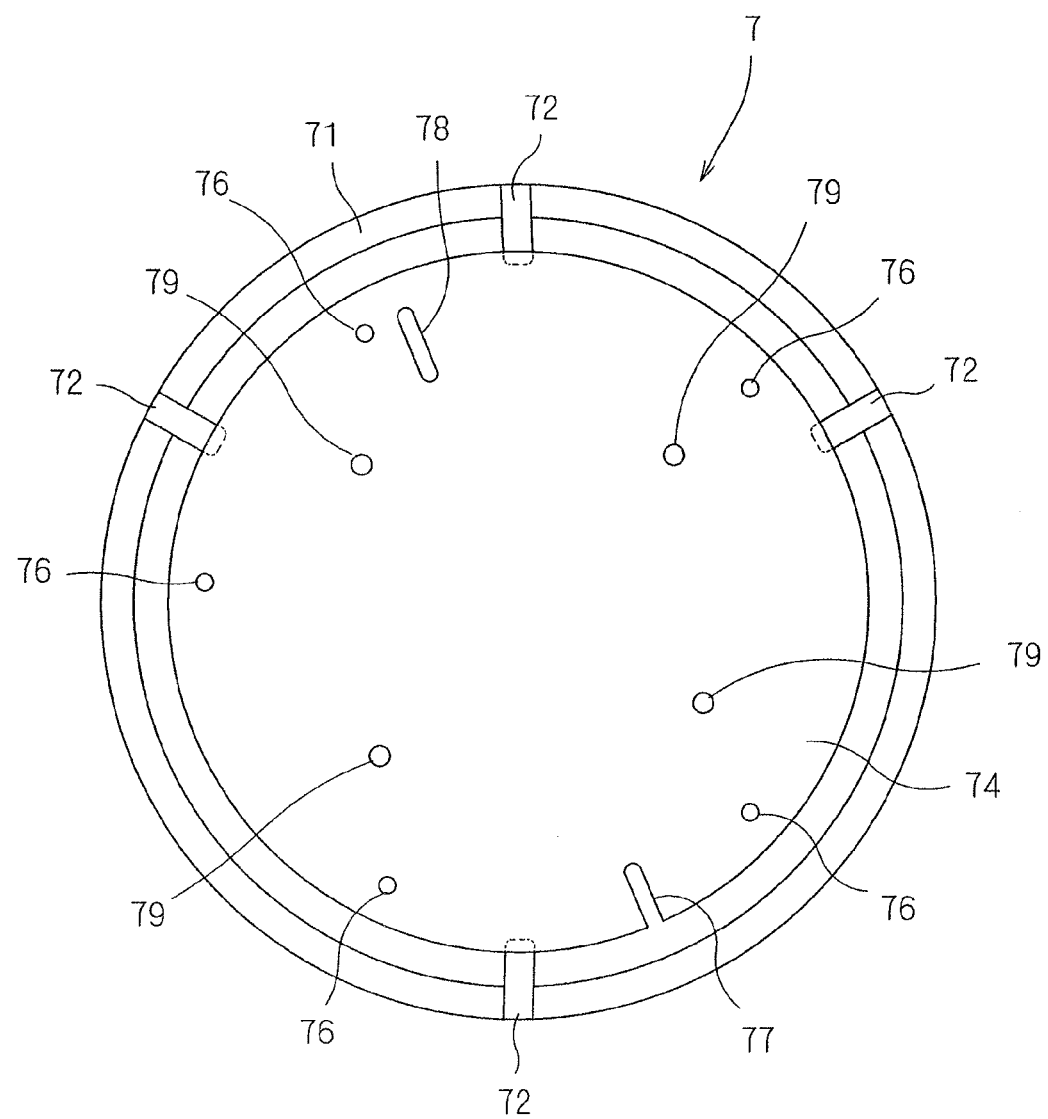
FIG. 3 is a top plan view of the holder.
Figure 4:
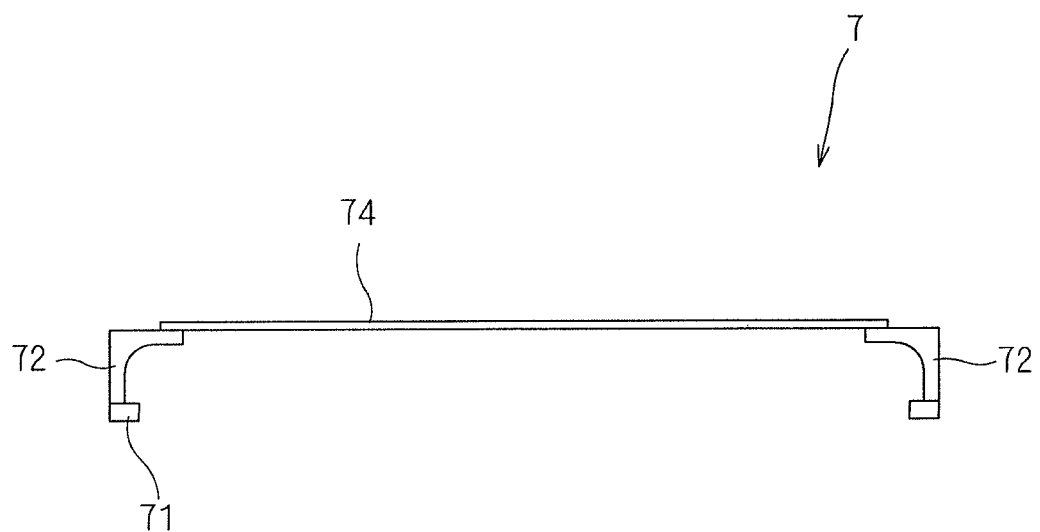
FIG. 4 is a side view of the holder as seen from one side.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74, and holds a semiconductor wafer W in the chamber 6. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The planar susceptor 74 is supported by the four coupling portions 72 provided on the base ring 71. The susceptor 74 is a generally circular planar member made of quartz. The diameter of the susceptor 74 is greater than the diameter of a semiconductor wafer W. In other words, the susceptor 74 has a size, as seen in plan view, greater than that of the semiconductor wafer W. Multiple (in this preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal position (a position such that the normal to the susceptor 74 coincides with a vertical direction). A semiconductor wafer W transported into the chamber 6 is placed and held in a horizontal position on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiated light (infrared light) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

Figure 5:
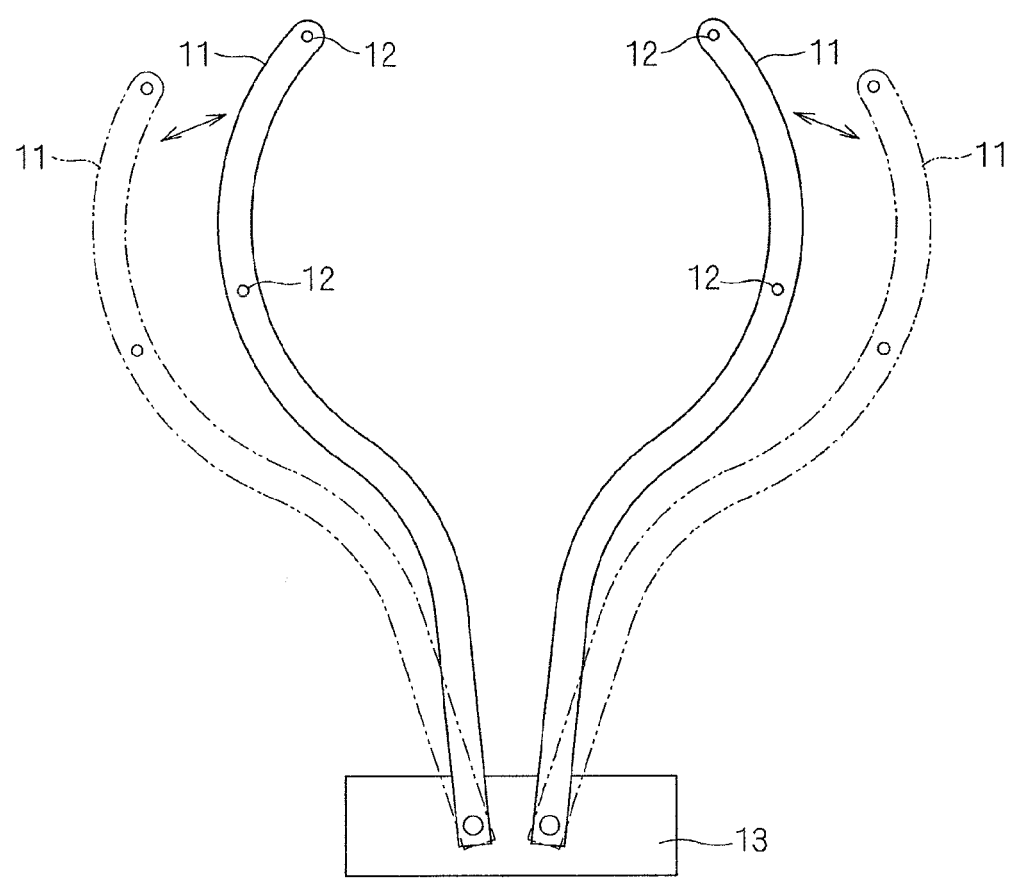
FIG. 5 is a plan view of a transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism (not shown) is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor portion of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Figure 8:
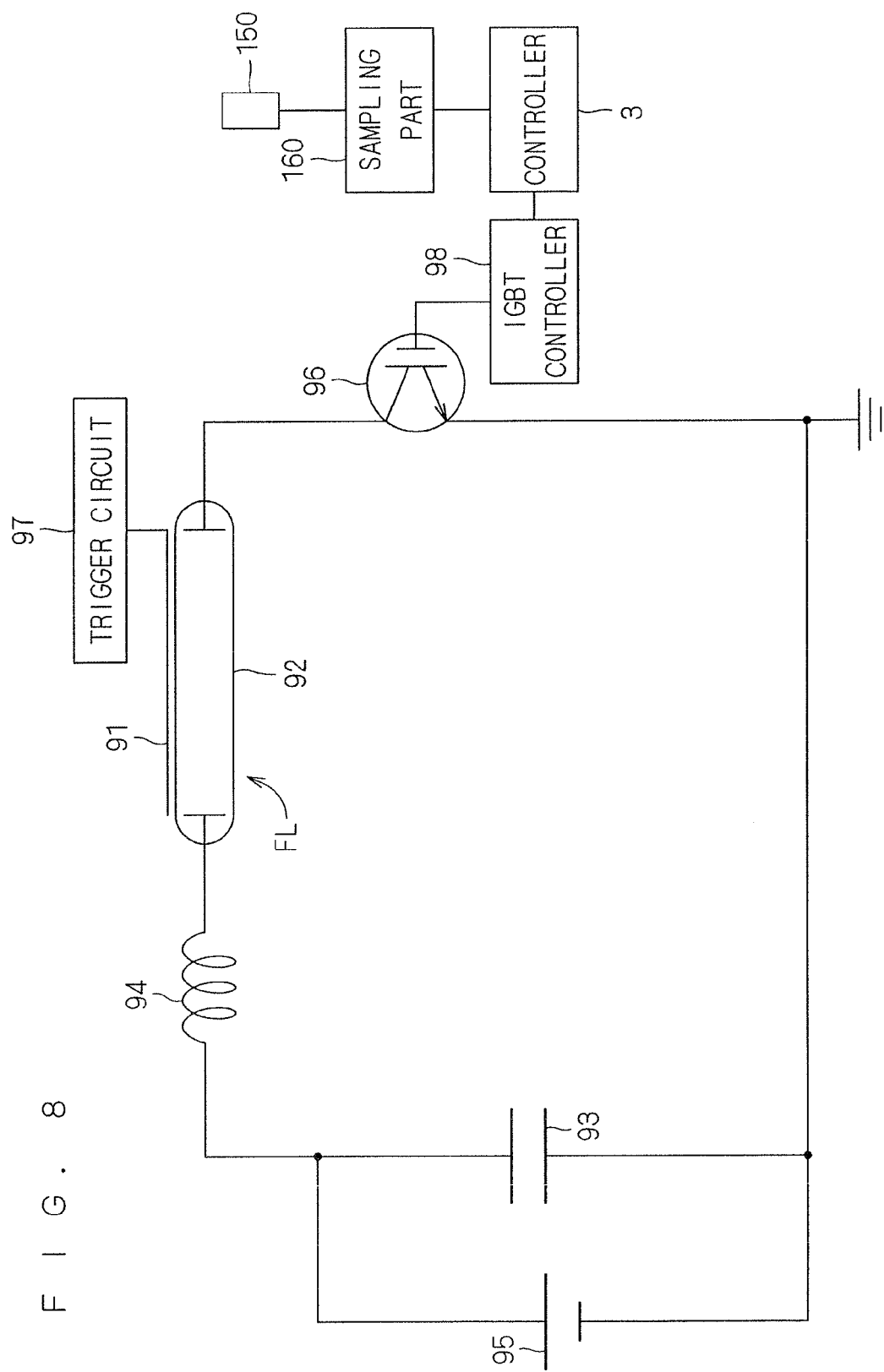
FIG. 8 is a diagram showing a driving circuit for a flash lamp.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. An IGBT controller 98 is connected to the gate of the IGBT 96. The IGBT controller 98 is a circuit for applying a signal to the gate of the IGBT 96 to drive the IGBT 96. Specifically, when the IGBT controller 98 applies a voltage ("high" voltage) not less than a predetermined level to the gate of the IGBT 96, the IGBT 96 turns on. When the IGBT controller 98 applies a voltage ("low" voltage) less than the predetermined level to the gate of the IGBT 96, the IGBT 96 turns off. In this manner, the circuit including the flash lamp FL is turned on and off by the IGBT 96. By turning the IGBT 96 on and off, the current flowing from the capacitor 93 to the flash lamp FL is interrupted. The IGBT controller 98 changes the IGBT 96 to be turned on and off under the control of the controller 3.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, if the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

The reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a stain finish thereon.

The multiple (in this preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In this preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals near the ends of the lamp arrangement than in the central portion thereof. This allows a greater amount of light to impinge upon the peripheral portion of the semiconductor wafer W where a temperature fall is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen and argon is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation to the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light, and is made of, for example, titanium (Ti). The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

Figure 9:
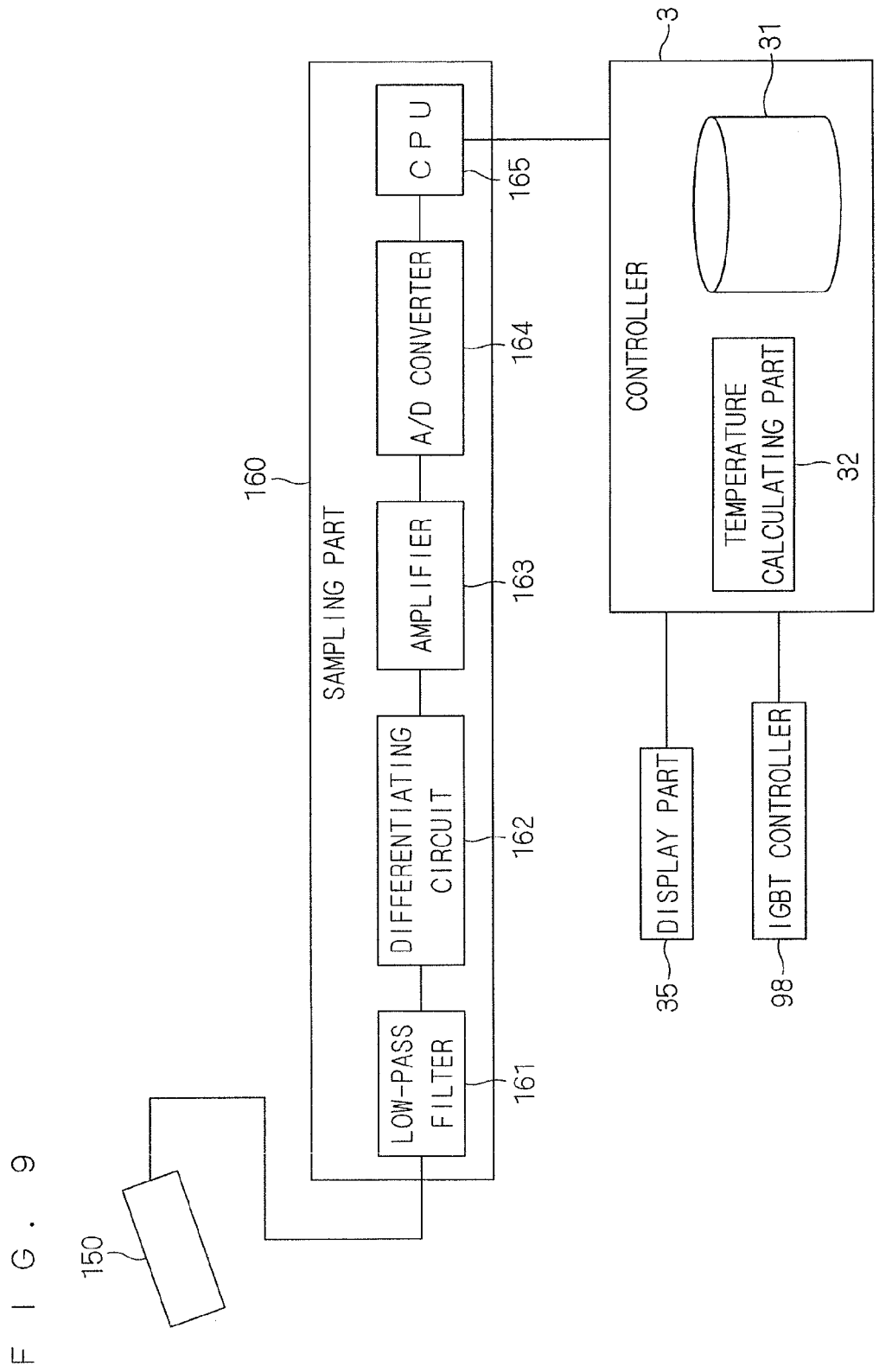
FIG. 9 is a block diagram showing configurations of a sampling part and a controller.

As shown in FIG. 8, the heat treatment apparatus 1 according to this preferred embodiment includes a sampling part 160 for sampling a signal outputted from the photodetector element 150 to transmit the sampled signal to the controller 3. FIG. 9 is a block diagram showing configurations of the sampling part 160 and the controller 3. The photodetector element 150 is installed in the upper portion of the inner wall of the chamber 6, and receives the radiated light from the surface of the semiconductor wafer W held by the holder 7. It should be noted that the photodetector element 150 may be provided with a filter for selectively allowing only the light of a predetermined wavelength range to pass therethrough.

The photodetector element 150 generates a change in resistance in accordance with the intensity of the received light. The photodetector element 150 formed of an InSb radiation thermometer is capable of performing high-speed measurement with an extremely short response time. The photodetector element 150 is electrically connected to the sampling part 160, and transmits a signal generated in response to light reception to the sampling part 160.

The sampling part 160 includes a low-pass filter 161, a differentiating circuit 162, an amplifier 163, an A/D converter 164, and a CPU 165, and measures the intensity of the radiated light received by the photodetector element 150. The low-pass filter (LPF) 161 removes a high-frequency noise from the signal transmitted from the photodetector element 150. The differentiating circuit 162 eliminates a DC component from the signal that has passed through the low-pass filter 161, to thereby extract a change amount of the signal. The differentiating circuit 162 may be configured using, e.g. AC coupling.

The amplifier 163 amplifies the signal outputted from the differentiating circuit 162 and transmits the amplified signal to the A/D converter 164. The A/D converter 164 converts the signal amplified by the amplifier 163 to a digital signal. The CPU 165 executes a predetermined processing program and samples the digital signals outputted from the A/D converter 164 at predetermined time intervals, to thereby sequentially store the digital signals in a memory (not shown) separately provided. In other words, the sampling part 160 measures the levels of the signals transmitted from the photodetector element 150 in chronological order, to thereby obtain a plurality of pieces of signal level data. The CPU 165 of the sampling part 160 is tailored for sampling of the signals from the photodetector element 150, whereby the sampling interval is set to approximately several microseconds. The CPU 165, the A/D converter 164, the memory and the like may be incorporated into a single one-chip microcomputer.

The CPU 165 of the sampling part 160 is connected to the controller 3 via a communication line. The controller 3 controls the above-mentioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk 31 for storing control software, data and the like therein. The controller 3 is connected to the IGBT controller 98 and a display part 35, and is capable of controlling the operation of the IGBT controller 98 as well as causing the display part 35 to display the computation results or the like thereon. It suffices that the display part 35 is formed of, for example, a liquid crystal display or the like.

The controller 3 can perform a general-purpose process but cannot perform sampling at time intervals as short as the CPU 165 of the sampling part 160. The signal level data stored in the memory by the CPU 165 is transferred to the controller 3 and stored in the magnetic disk 31. The controller 3 further includes a temperature calculating part 32. The temperature calculating part 32 is a functional processor implemented by executing a predetermined processing program by the CPU of the controller 3, and the processing thereof is further described below. The communication line connecting the sampling part 160 and the controller 3 to each other may provide serial communication or parallel communication.

The heat treatment apparatus 1 further includes, in addition to the above-mentioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities with which the semiconductor substrate W is doped are activated by the heat treatment apparatus 1 performing the process of heating (annealing) the semiconductor wafer W by flash irradiation. The procedure for the treatment in the heat treatment apparatus 1 which will be described below proceeds under the control of the controller 3 over the operating mechanisms of the heat treatment apparatus 1.

Figure 10:
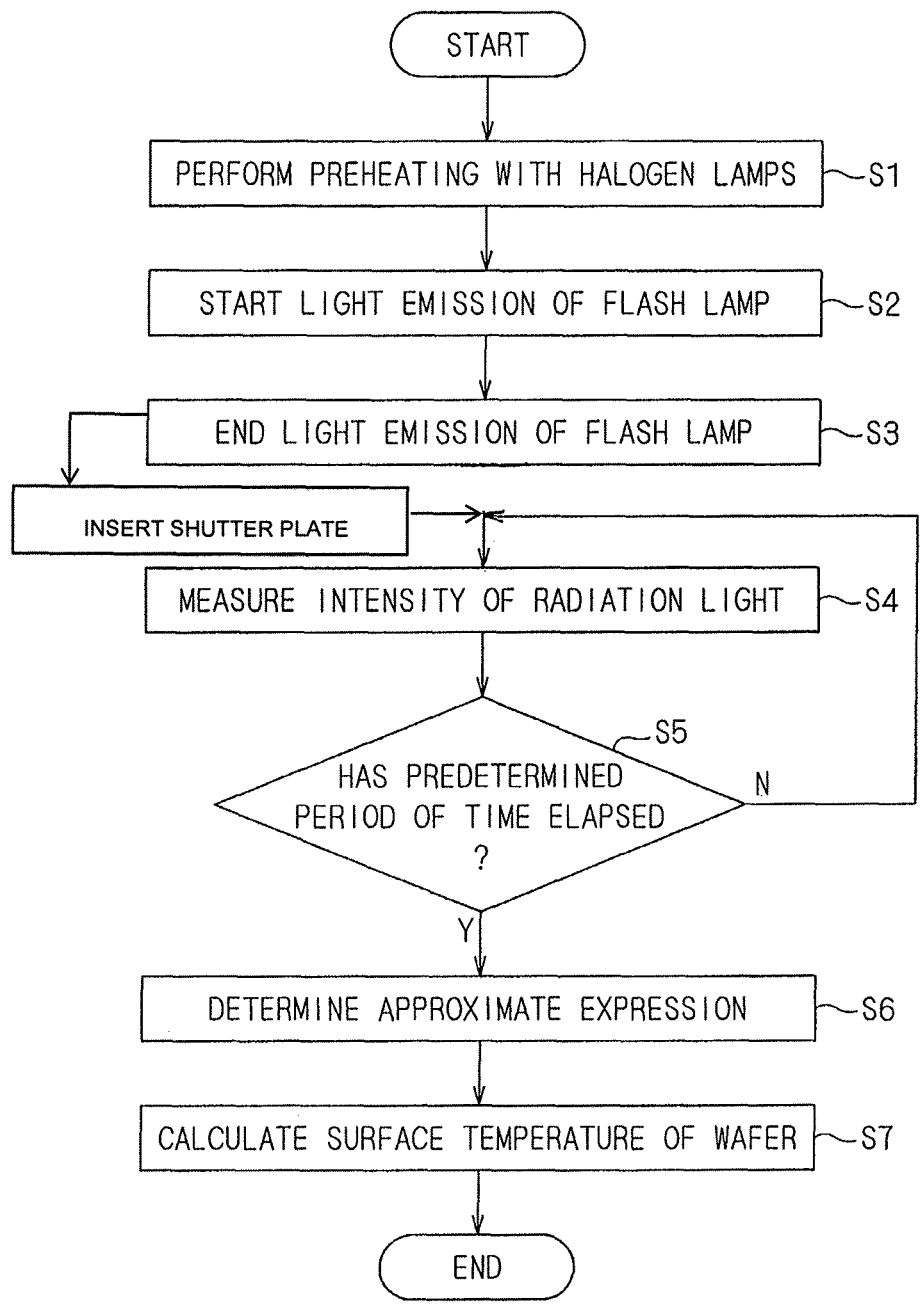
FIG. 10 is a flowchart showing a procedure for treatment in the heat treatment apparatus of FIG. 1.

FIG. 10 is a flowchart showing the procedure for treatment in the heat treatment apparatus 1. First, prior to the treatment, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism (not shown) exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with processing steps.

Subsequently, the gate valve 185 is opened to open the transport opening 66. A transport robot outside the heat treatment apparatus 1 transports an impurity-implanted semiconductor wafer W through the transport opening 66 into the heat treatment space 65 in the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal position. The semiconductor wafer W is held on the susceptor 74 so that the impurity-implanted surface thereof is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

After the semiconductor wafer W is placed and held on the susceptor 74 of the holder 7, the 40 halogen lamps HL in the halogen heating part 4 turn on simultaneously to start preheating (assist heating) (Step S1). Halogen light emitted from the halogen lamps HL is transmitted through the lower chamber window 64 and the susceptor 74 both made of quartz, and impinges upon the back surface of the semiconductor wafer W. The semiconductor wafer W is irradiated with the halogen light from the halogen lamps HL, so that the temperature of the semiconductor wafer W rises. It should be noted that the transfer arms 11 of the transfer mechanism 10, which are retracted to the inside of the recessed portion 62, do not become an obstacle to the heating using the halogen lamps HL.

Figure 11:
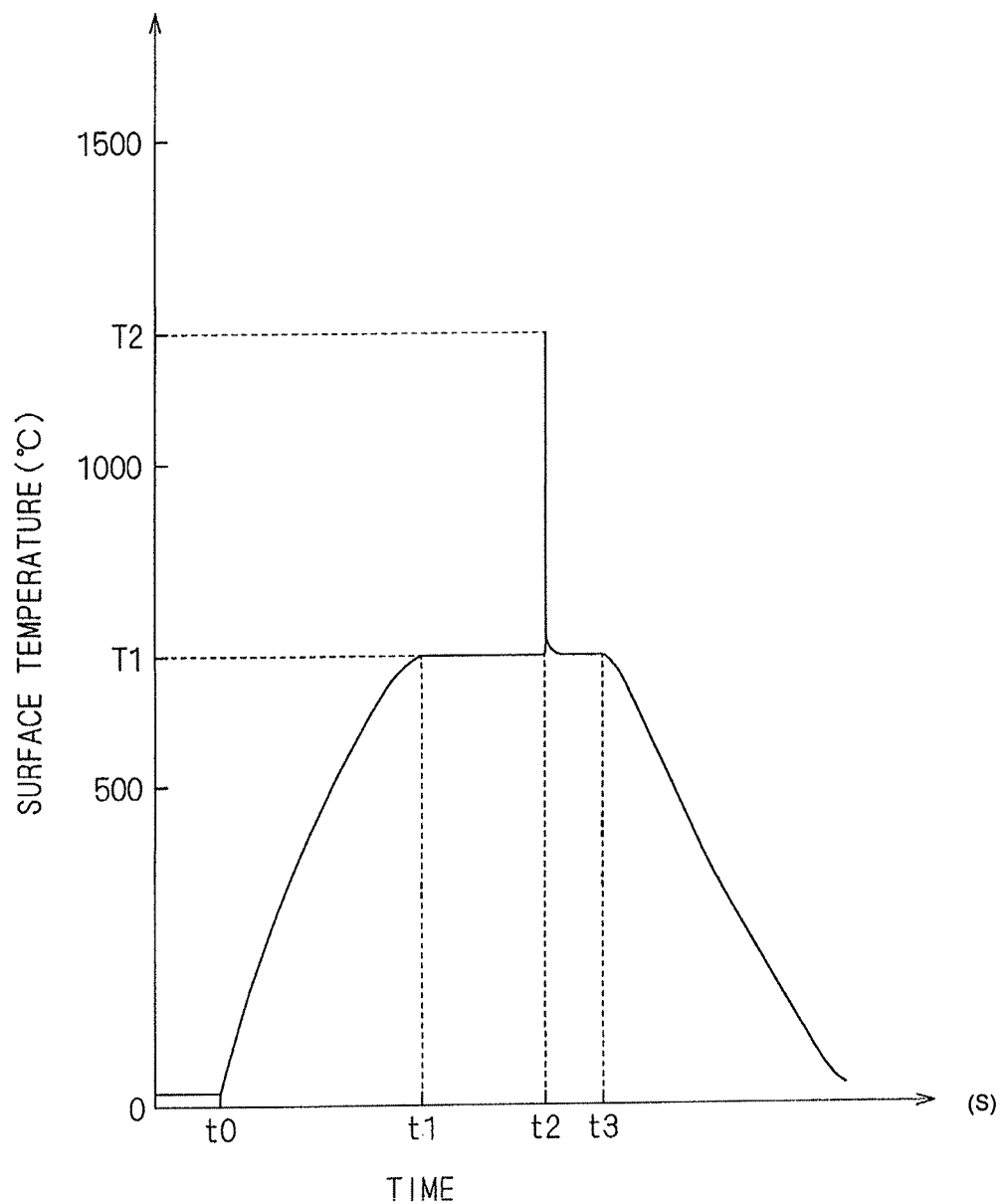
FIG. 11 is a graph showing changes in the surface temperature of a semiconductor wafer.

FIG. 11 is a graph showing changes in the surface temperature of the semiconductor wafer W. After the semiconductor wafer W is transported into the heat treatment space 65 and is placed on the susceptor 74, the controller 3 turns on the 40 halogen lamps HL at time t0, so that the temperature of the semiconductor wafer W irradiated with the halogen light is raised to a preheating temperature T1. The preheating temperature T1 is 300° C. or higher and 800° C. or lower.

In preheating with the halogen lamps HL, the temperature of the semiconductor wafer W is measured with the contact-type thermometer 130. That is, the contact-type thermometer 130 including a built-in thermocouple comes into contact with the lower surface of the semiconductor wafer W held by the susceptor 74 through the notch 77, to thereby measure the wafer temperature during temperature rise. The measured temperature of the semiconductor wafer W is transmitted to the controller 3. The controller 3 controls the output from the halogen lamps HL while monitoring whether or not the temperature of the semiconductor wafer W, which rises by irradiation from the halogen lamps HL, reaches the predetermined preheating temperature T1. That is, the controller 3 effects feedback control of the output from the halogen lamps HL, based on the measurement value of the contact-type thermometer 130, so that the temperature of the semiconductor wafer W is equal to the preheating temperature T1. When the temperature of the semiconductor wafer W is raised by irradiation from the halogen lamps HL, the temperature is not measured with the radiation thermometer 120. This is because the halogen light radiated from the halogen lamps HL enters the radiation thermometer 120 as ambient light, whereby the temperature cannot be measured accurately.

After the temperature of the semiconductor wafer W reaches the preheating temperature T1, the controller 3 maintains the temperature of the semiconductor wafer W at the preheating temperature T1 for a short time interval. Specifically, at time t1 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly raised to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in a region opposed to the peripheral portion of the semiconductor wafer W than in a region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL start emitting a flash of light at time t2 when a predetermined period of time has elapsed since the temperature of the semiconductor wafer W reached the preheating temperature T1 (Step S2). It should be noted that a time interval when the temperature of the semiconductor wafer W reaches the preheating temperature T1 from the room temperature (a time interval between the time t0 and the time t1) and the time interval when the flash lamps FL emit light after reaching the preheating temperature T1 (a time interval between the time t1 and the time t2) are only on the order of several seconds. For the flash irradiation from a flash lamp FL, the capacitor 93 is charged in advance by the power supply unit 95. Then, with the capacitor 93 in the charged state, the IGBT controller 98 outputs a pulse signal to the gate of the IGBT 96 under the control of the controller 3 to drive the IGBT 96 on and off.

The waveform of the pulse signal outputted from the IGBT controller 98 is specified by inputting, to the controller 3, a recipe that is a sequence of defined parameters indicating a time interval (ON time) equivalent to the pulse width and a time interval (OFF time) equivalent to the pulse interval between pulses. After an operator inputs such a recipe, the controller 3 sets a pulse waveform having repeated ON and OFF time intervals in accordance with the recipe. Then, the IGBT controller 98 outputs the pulse signal in accordance with the pulse waveform. As a result, the pulse signal having the set waveform is applied to the gate of the IGBT 96, so that driving the IGBT 96 on and off is controlled. Specifically, the IGBT 96 turns on when the pulse signal inputted to the gate of the IGBT 96 is on, whereas the IGBT 96 turns off when the pulse signal is off.

In synchronization with the timing when the pulse signal outputted from the IGBT controller 98 turns on, the controller 3 controls the trigger circuit 97 to apply a high voltage (trigger voltage) to the trigger electrode 91. With the electrical charges stored in the capacitor 93, the pulse signal is inputted to the gate of the IGBT 96, and the high voltage is applied to the trigger electrode 91 in synchronization with the timing when the pulse signal turns on. This causes a current to flow across the electrodes of the glass tube 92 without fail when the pulse signal is on, and the resultant excitation of xenon atoms or molecules induces light emission, whereby the flash lamp FL emits light.

The waveform of the current flowing through the glass tube 92 when the flash lamp FL emits light depends on the waveform of the pulse signal inputted to the gate of the IGBT 96. That is, the value of the current flowing through the glass tube 92 of the flash lamp FL increases when the pulse signal inputted to the gate of the IGBT 96 is on, and the value of the current decreases when the pulse signal is off, which specifies the sawtooth current waveform. It should be noted that an individual current waveform corresponding to each pulse is defined by the constant of the coil 94.

The emission intensity of the flash lamp FL is roughly proportional to the current flowing through the flash lamp FL. Thus, the intensity waveform (profile) of the light emission output from the flash lamp FL is approximately similar to the waveform of the current flowing through the flash lamp FL. In this manner, the flash lamp FL emits light, whereby flash irradiation is performed on the surface of the semiconductor wafer W held by the holder 7.

In a case where the flash lamp FL is caused to emit light without using the IGBT 96, the electrical charges stored in the capacitor 93 are consumed by single light emission, and the intensity waveform from the flash lamp FL is obtained as a single pulse having a width of approximately 0.1 milliseconds to 10 milliseconds. On the other hand, in this preferred embodiment, the IGBT 96 serving as a switching element is connected in the circuit, and a pulse signal is outputted to the gate of the IGBT 96. Accordingly, the electrical charges are intermittently supplied from the capacitor 93 to the flash lamp FL by the IGBT 96, so that the current flowing through the flash lamp FL is controlled. As a result, so to speak, light emission from the flash lamp FL is subjected to chopper control, and the electrical charges stored in the capacitor 93 are consumed in a divided manner, so that the flash lamp FL repeats blinking in an extremely short period of time. It should be noted that the current value increases again by application of the following pulse to the gate of the IGBT 96 before the value of the current flowing through the flash lamp FL becomes exactly "0", which means that the emission intensity does not become exactly "0" also while the flash lamp FL repeats blinking.

Such flash irradiation from the flash lamp FL is performed on the semiconductor wafer W, whereby the surface temperature of the semiconductor wafer W is raised from the preheating temperature T1 to the treatment temperature T2. This allows activation of the implanted impurities. The treatment temperature T2 is 1,000° C. or higher and 1,400° C. or lower at which the activation of the implanted impurities is achieved. The time waveform of emission intensity of the flash lamp FL may be changed as appropriate by adjusting the waveform of the pulse signal to be applied to the gate of the IGBT 96. The time waveform of emission intensity may be determined in accordance with an object of the heat treatment (for example, activation of implanted impurities or the process of recovering crystal defects caused in the implantation of impurities). It should be noted that even if the time waveform of emission intensity of the flash lamp FL has any form, the total emission time of the flash lamp FL in single heating is one second or less. The waveform of the pulse signal applied to the gate of the IGBT 96 may be adjusted in accordance with the time interval equivalent to the pulse width and time interval equivalent to a pulse interval between pulses inputted to the controller 3.

When flash irradiation from the flash lamp FL is ended, the IGBT 96 turns off, and the light emission from the flash lamp FL is stopped (Step S3). This causes the surface temperature of the semiconductor wafer W to start falling rapidly from the treatment temperature T2. Then, the halogen lamps HL turn off at time t3 after a lapse of a predetermined period of time since the light emission from the flash lamp FL stops. This causes the temperature of the semiconductor wafer W to start falling from the preheating temperature T1. At the same time that the halogen lamps HL turn off, the shutter mechanism 2 inserts the shutter plate 21 into the light shielding position lying between the halogen heating part 4 and the chamber 6. The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the speed at which the temperature of the semiconductor wafer W decreases.

The temperature measurement with the radiation thermometer 120 is started at the time when the shutter plate 21 is inserted into the light shielding position. That is, the intensity of the infrared light radiated from the lower surface of the semiconductor wafer W held by the holder 7 through the opening 78 of the susceptor 74 is measured with the radiation thermometer 120, thereby measuring the temperature of the semiconductor wafer W during temperature fall. The measured temperature of the semiconductor wafer W is transmitted to the controller 3.

While light is continued to be radiated more or less from the high-temperature halogen lamps HL immediately after turning off, the radiation thermometer 120 measures the temperature of the semiconductor wafer W when the shutter plate 21 is inserted into the light shielding position, whereby the radiated light directed from the halogen lamps HL toward the heat treatment space 65 in the chamber 6 is intercepted. Therefore, the radiation thermometer 120 is not affected by ambient light, and accordingly, is capable of accurately measuring the temperature of the semiconductor wafer W held by the susceptor 74.

The controller 3 monitors whether or not the temperature of the semiconductor wafer W that is measured with the radiation thermometer 120 has fallen to a predetermined temperature. Then, after the temperature of the semiconductor wafer W falls to be equal to or lower than a predetermined temperature, the pair of transfer arms 11 of the transfer mechanism 10 is again moved horizontally from the retracted position to the transfer operation position and moved upwardly, whereby the lift pins 12 protrude from the upper surface of the susceptor 74 to receive the semiconductor wafer W after the heat treatment from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

FIG. 12 is a graph showing changes in the level of a signal outputted from the photodetector element 150 to the sampling part 160. In FIG. 12, time $t_{on}$ is the time when the flash lamp FL starts emitting light in Step S2, and time $t_{off}$ is the time when the flash lamp FL stops emitting light in Step S3. The times shown in FIG. 12 are all near the time t2 in FIG. 11, and the graph of FIG. 11 is plotted with a time scale of seconds, whereas the graph of FIG. 12 is plotted with a time scale of milliseconds. Thus, the times $t_{on}$ and $t_{off}$ of FIG. 12 are shown as overlaid on the time t2 in FIG. 11.

Prior to the time $t_{on}$ when the flash lamp FL starts emitting light, for example, the reflected light from the halogen lamps HL that perform preheating enters the photodetector element 150, and the photodetector element 150 outputs an approximately uniform low-level signal. When the flash lamp FL emits light at the time $t_{on}$, the flash of light enters the photodetector element 150 directly or after being reflected off the surface of the semiconductor wafer W or the wall surface of the chamber 6. The intensity of the flash of light radiated from the flash lamp FL is considerably large, which exceeds the limit detectable by the photodetector element 150. Therefore, the signal outputted from the photodetector element 150 that has received the flash of light momentarily reaches a level of saturation $V_s$ at the time $t_{on}$ when the light emission is started. Then, while the flash lamp FL keeps emitting light, that is, from the time $t_{on}$ when light emission is started to the time $t_{off}$ when light emission is stopped, the photodetector element 150 keeps receiving a flash of light, and the signal outputted from the photodetector element 150 remains at the level of saturation $V_s$.

On the other hand, the temperature of the semiconductor wafer W has been raised to the preheating temperature T1 by preheating with the halogen lamps HL, and the temperature of the surface thereof is further raised from the preheating temperature T1 by flash irradiation from the flash lamp FL that has started emitting light at the time $t_{on}$. The radiated light having the intensity corresponding to the temperature is radiated from the surface of the semiconductor wafer W whose temperature has been raised. The radiated light from the surface of the semiconductor wafer W is also received by the photodetector element 150, which exceeds the detection limit due to the unnecessarily intense flash of light while the flash lamp FL keeps emitting light. Thus, the photodetector element 150 cannot output the signal indicating the intensity of the radiated light received from the semiconductor wafer W. That is, due to the considerably intense flash of light serving as a background, the photodetector element 150 loses a detection function and cannot detect the radiated light from the surface of the semiconductor wafer W.

When the light emission from the flash lamp FL stops at the time $t_{off}$, a flash of light exerts no influence, whereby the signal outputted from the photodetector element 150 becomes lower than the level of saturation $V_s$. In other words, the photodetector element 150 restores a detection function. This enables the photodetector element 150 to receive the radiated light from the surface of the semiconductor wafer W and output the intensity thereof to the sampling part 160. Strictly speaking, after the flash lamp FL stops emitting light at the time $t_{off}$, in addition to the radiated light from the surface of the semiconductor wafer W, the halogen light from the halogen lamps HL that keep turning on enters the photodetector element 150. However, the photodetector element 150 is provided on the front surface side of the semiconductor wafer W held by the holder 7, whereas the halogen lamps HL are provided on the back surface side of the semiconductor wafer W. Accordingly, the halogen light dose not directly enter the photodetector element 150. The reflected light of the halogen light that has slightly entered the photodetector element 150 exerts an influence at an approximately consistent level, and thus the influence is eliminated by the differentiating circuit 162 of the sampling part 160.

After the light emission from the flash lamp FL stops at the time $t_{off}$ and the photodetector element 150 restores a detection function, the intensity of the radiated light from the surface of the semiconductor wafer W is measured by the sampling part 160 based on the signal outputted from the photodetector element 150 (Step S4). The measurement by the sampling part 160 may be started at the time when it is detected that the level of the signal outputted from the photodetector element 150 becomes lower than the level of saturation $V_s$, or may be started at the time $t_{off}$ (which is recognizable in advance from the recipe inputted to the controller 3) when the flash lamp FL stops emitting light.

The signal outputted from the photodetector element 150 passes through the low-pass filter 161, whereby a noise is removed. Subsequently, the signal is inputted to the differentiating circuit 162, whereby a DC component is eliminated. On this occasion, an influence of the halogen light from the halogen lamps HL is eliminated as well. After that, the signal outputted from the differentiating circuit 162 is amplified by the amplifier 163, and then, is converted by the A/D converter 164 to a digital signal suitably handled by a computer. Then, the level of the digital signal to be outputted from the A/D converter 164 serves as the voltage inputted to the CPU 165, which is obtained as the level of the signal outputted from the photodetector element 150. The level of the signal obtained by the CPU 165 of the sampling part 160 shows the intensity of the radiated light received by the photodetector element 150, and data of the signal level is transmitted to the controller 3. The controller 3 stores the transferred level of the signal outputted from the photodetector element 150 in a storage part such as a magnetic disk 31.

In this manner, the sampling part 160 performs single sampling of the intensity of radiated light on the surface of the semiconductor wafer W. Then, the sampling part 160 repeats the measurement of the intensity of radiated light several times until a predetermined period of time elapses (Steps S4 and S5). Accordingly, after the flash lamp FL stops emitting light, the sampling part 160 obtains multiple intensities of radiated light from the surface of the semiconductor wafer W in chronological order. It suffices that the predetermined period of time for sampling is, for example, a period of time from when the flash lamp FL stops emitting light to when the temperature of the surface of the semiconductor wafer W decreases to the temperature near the preheating temperature T1.

After the flash lamp FL stops emitting light at the time $t_{off}$, the surface temperature of the semiconductor wafer W falls rapidly, and thus, the intensity of radiated light drops rapidly as well. However, the photodetector element 150 formed as the InSb radiation thermometer has an extremely short response time, and accordingly, is capable of following the radiated light from the semiconductor wafer W, the intensity of which dramatically changes in a short period of time. This results in that a sampling interval of the intensity of radiated light by the sampling part 160 is set to several tens of microseconds. Accordingly, it is possible to measure multiple intensities of radiated light in chronological order during a time period from when the flash lamp FL stops emitting light to when the temperature of the surface of the semiconductor wafer W decreases to the temperature near the preheating temperature T1.

In this preferred embodiment, as shown in FIG. 12, the sampling part 160 measures the intensity of the radiated light from the surface of the semiconductor wafer W, i.e. the level of a signal outputted from the photodetector element 150, n times (where n is an integer not less than two) at times t21, t22, t23, . . . , tn. This causes the sampling part 160 to obtain the levels of output signals $V_1, V_2, V_3, \ldots, V_n$ from the photodetector element 150 at the times t21, t22, t23, . . . , tn, respectively, in chronological order. The levels of output signals $V_1, V_2, V_3, \ldots, V_n$ from the photodetector element 150 that have been obtained in chronological order as described above are transmitted from the sampling part 160 to the controller 3, and are associated with the times of measurement to be stored in the storage part such as the magnetic disk 31.

Next, the temperature calculating part 32 of the controller 3 calculates the surface temperature of the semiconductor wafer W heated by flash irradiation, based on the intensity of the radiated light from the surface of the semiconductor wafer W obtained as described above. First, the temperature calculating part 32 obtains an approximate expression indicating a time variance of the intensity of radiated light from multiple intensities of radiated light measured in chronological order (Step S6). The times of measurement t21, t22, t23, . . . , tn and the levels of output signals $V_1, V_2, V_3, \ldots, V_n$ from the photodetector element 150, which are associated with each other, are stored in the magnetic disk 31 of the controller 3. The temperature calculating part 32 obtains an approximate expression indicating a time variance of the intensity of radiated light from the pieces of measured data.

As the technique of obtaining an approximate expression, it is preferable that an appropriate function be assumed, and the least squares method be used such that the function has the best approximation to the pieces of measured data. Specifically, the measured value of the level of an output signal shows a decline curve as shown in FIG. 12, and thus, an exponential function as expressed in Expression (1) below is assumed to be the function assumed from this decline curve.

$$f(t-a)=b^t+c \quad (1)$$

where a variable t is a time. In the least squares method, coefficients a, b and c are determined so as to obtain the smallest sum of squares of differences between the levels of output signals $V_1, V_2, V_3, \ldots, V_n$ at the times of measurement t21, t22, t23, . . . , tn, respectively, and f(t−a). In this manner, the temperature calculating part 32 obtains an approximate expression indicating a time variance of the intensity of radiated light from the surface of the semiconductor wafer W from pieces of measured data.

Subsequently, the temperature calculating part 32 obtain the intensity of radiated light at an appropriate time t by substituting the time t into the approximate expression obtained as described above, thereby calculating the surface temperature of the semiconductor wafer W at the time t from the obtained value (Step S7). In order to obtain the surface temperature from the intensity of radiated light on the surface of the semiconductor wafer W, a well-known computation technique can be used, in which Planck's law regarding black body radiation or Stefan-Boltzmann law derived therefrom is used. Alternatively, a table in which the attained temperature obtained from the sheet resistance value of the semiconductor wafer W that is measured after flash irradiation and the intensity of radiated light (level of a signal outputted from the photodetector element 150) are associated with each other in advance may be created to be stored in, for example, the magnetic disk 31, to thereby obtain the surface temperature from the intensity of radiated light based on the table. The controller 3 may cause the display part 35 to display the surface temperature of the semiconductor wafer W calculated in this manner thereon.

The above-mentioned approximate expression, based on which the surface temperature is calculated, is approximated by the measured data in the stage in which the surface temperature of the semiconductor wafer W falls rapidly after the flash lamp FL stops emitting light. Therefore, the time t substituted into the approximate expression at least needs to be the time when the surface temperature of the semiconductor wafer W falls and thereafter. The time $t_{off}$ when the flash lamp FL stops emitting light and thereafter are desirable for achieving higher calculation accuracy.

Figure 13:
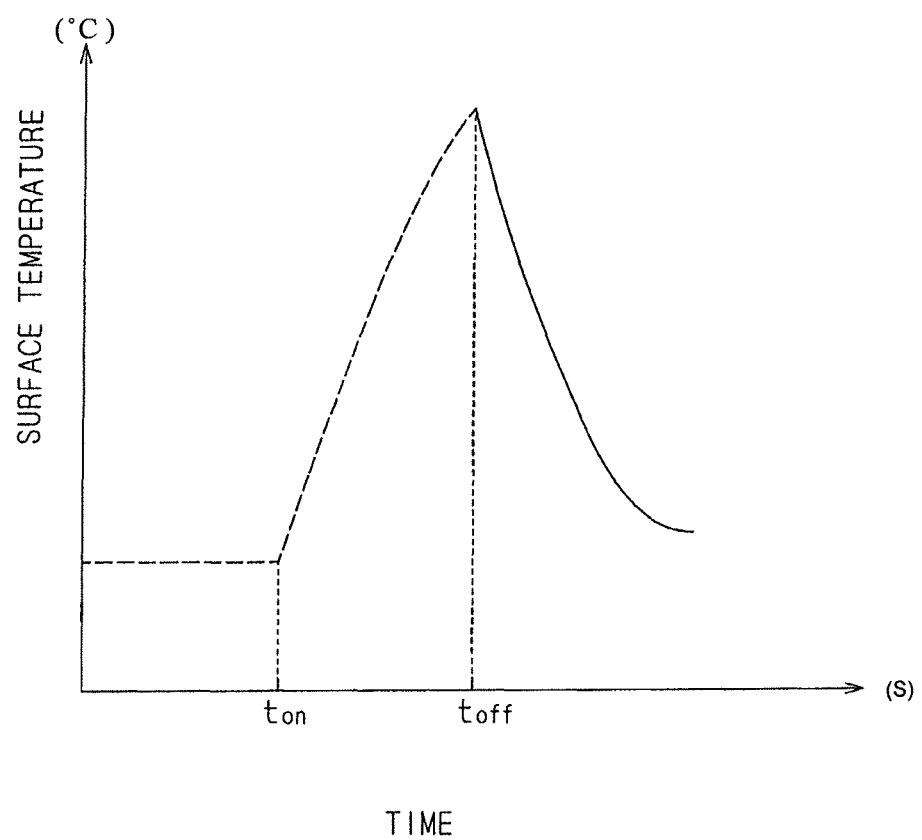
FIG. 13 is a graph showing changes in the surface temperature of a semiconductor wafer by flash irradiation.

FIGS. 13 and 14 are graphs showing changes in the surface temperature of the semiconductor wafer W by flash irradiation. In FIG. 13 and FIG. 14, the surface temperatures at the time $t_{off}$ when the flash lamp FL stops emitting light and thereafter are indicated by a solid line. It is possible to obtain the surface temperature indicated by a solid line with high accuracy by the technique according to this preferred embodiment.

The time when the surface temperature of the semiconductor wafer W falls depends on the waveform of a current flowing through the flash lamp FL in flash irradiation. In a case of the waveform such that the current flowing through the flash lamp FL has an approximately constant value for a predetermined period of time, as shown in FIG. 13, the surface temperature of the semiconductor wafer W reaches the maximum temperature (treatment temperature T2) at the time $t_{off}$ when the flash lamp FL stops emitting light, and starts falling thereafter. In such a case, the temperature calculating part 32 substitutes the time $t_{off}$ when the flash lamp FL stops emitting light into the approximate expression, thereby calculating the maximum temperature that the surface temperature of the semiconductor wafer W has reached. It should be noted that the waveform of the current flowing through the flash lamp FL can be adjusted by the waveform of the pulse signal applied to the gate of the IGBT 96.

Meanwhile, in the case of the waveform in which a relatively small current flows through the flash lamp FL for a long period of time in flash irradiation, as shown in FIG. 14, the surface temperature of the semiconductor wafer W reaches a maximum temperature prior to the time $t_{off}$ when the flash lamp FL stops emitting light. In this case, the temperature calculating part 32 is capable of calculating the surface temperature of the semiconductor wafer W at the time $t_{off}$ when the flash lamp FL stops emitting light by substituting the time $t_{off}$ into the approximate expression. Needless to say, the same waveform of the current flowing through the flash lamp FL results in the same variation pattern of the surface temperature of the semiconductor wafer W, which makes a difference between the surface temperature of the semiconductor wafer W at the time $t_{off}$ and the maximum attained temperature nearly constant. Accordingly, if a difference therebetween is determined in advance, it is possible to calculate the maximum temperature that the surface temperature of the semiconductor wafer W has reached by adding the difference to the surface temperature of the semiconductor wafer W at the time $t_{off}$ calculated from the above-mentioned approximate expression.

In this preferred embodiment, the intensity of the radiated light from the surface of the semiconductor wafer W is not measured while the flash lamp FL emits light (from the time $t_{on}$ when light emission is started to the time $t_{off}$ when light emission is stopped) in which the photodetector element 150 loses a detection function but is measured by the sampling part 160 after the flash lamp FL stops irradiation at the time $t_{off}$ and the photodetector element 150 restores a detection function. Then, the temperature calculating part 32 calculates the surface temperature of the semiconductor wafer W that has been heated by flash irradiation, based on the intensity of the radiated light from the surface of the semiconductor wafer W that has been measured by the sampling part 160 after flash irradiation from the flash lamp FL is stopped.

Therefore, even if the intensity of a flash of light radiated from the flash lamp FL is considerably large, the flash of light does not become an ambient light. Accordingly, an influence of the flash of light can be eliminated, which enables to accurately measure the intensity of the radiated light from the surface of the semiconductor wafer W. This results in that the surface temperature of the semiconductor wafer W can be obtained even in a case where intense irradiation is performed in an extremely short period of time, as performed by the flash lamp FL.

While the preferred embodiment according to the present invention has been described hereinabove, various modifications of the present invention in addition to that described above may be made without departing from the scope and spirit of the invention. For example, the function assumed in the approximate expression is an exponential function in the preferred embodiment above, which is not limited thereto. Alternatively, the exponentiation function, linear function or polynomial function may be assumed in accordance with the measured data.

Also, the setting of the waveform of the pulse signal is not limited to inputting the parameters including the pulse width one by one to the controller 3. For example, the setting of the waveform may be done by an operator inputting the waveform directly in graphical form to the controller 3, by reading the waveform previously set and stored in a storage part such as a magnetic disk, or by downloading the waveform from outside the heat treatment apparatus 1.

Also, while the trigger voltage is applied to the trigger electrode 91 in synchronization with the timing when the pulse signal turns on in the preferred embodiment above, the timing when the trigger voltage is applied is not limited thereto. Alternatively, the trigger voltage may be applied at regular intervals irrespective of the waveform of a pulse signal. Still alternatively, in a case where the intervals between pulse signals are short and, a current is caused to pass through the flash lamp FL at a pulse in the state in which the current value of a current that has flowed through the flash lamp FL at a previous pulse remains for a predetermined value or more, the current keeps flowing through the flash lamp FL as it is. Accordingly, it is not required to apply the trigger voltage per pulse and, for example, the trigger voltage may be applied only in the application of the first pulse. That is, the trigger voltage may be applied at an appropriate timing as long as a current is caused to flow through the flash lamp FL when the pulse signal turns on.

Although the IGBT 96 is used as a switching element in the preferred embodiment above, another transistor capable of turning on and off the circuit in accordance with the signal level inputted to the gate thereof may be used in place of the IGBT 96. It is, however, preferable to use an IGBT and a gate turn-off (GTO) thyristor which are suitable for handling high power as a switching element because the emission of light from the flash lamps FL consumes considerably high power.

Although the 30 flash lamps FL are provided in the flash heating part 5 according to the preferred embodiment above, the present invention is not limited thereto. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Also, in the preferred embodiment above, the semiconductor wafer W is preheated by irradiating the semiconductor wafer W with halogen light from the halogen lamps HL. The technique for preheating is not limited thereto, but the semiconductor wafer W may be preheated by placing the semiconductor wafer W on a hot plate.

Also, the technique according to the present invention is applicable not only to irradiation with a flash of light from the flash lamps FL, but also to the case where the semiconductor wafer W is heated by intense irradiation in an extremely short period of time such as irradiation with laser light. In irradiation with a flash of light and irradiation with laser light, the photodetector element 150 loses a detection function because intense irradiation is performed in an extremely short period of time. After irradiation is stopped, the photodetector element 150 restores a detection function and then measures the intensity of the radiated light from the surface of the semiconductor wafer W, whereby it is possible to calculate the surface temperature as in the embodiment above. Further, in a case where a sensor loses a detection function during heating, the technique according to the present invention is applicable. For example, a temperature sensor may lose a detection function due to a high-frequency noise in high-frequency heating and, in such a case, the temperature of a substrate to be processed or treated can be calculated with the technique according to the present invention.

Moreover, a substrate to be processed or treated by the heat treatment technique according to the present invention is not limited to a semiconductor wafer, but may be a glass substrate for use in a flat panel display for a liquid crystal display and the like, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A method for a heat treatment apparatus heating a substrate by irradiating the substrate with light, comprising the steps of:
    (a) irradiating a substrate with light from a plurality of halogen lamps, to thereby preheat the substrate;
    (b) irradiating the substrate with light from a plurality of flash lamps after said step (a);
    (c) measuring an intensity of radiated light from a surface of said substrate, the radiated light being received by a photodetector element after the irradiation in said step (b) is stopped and said photodetector element recovers a detection function thereof, and an output signal from said photodetector element becomes lower than a level of saturation;
    (d) calculating, using a controller having a CPU, a ROM and a RAM, a temperature of the surface of said substrate heated in said step (b) based on the intensity of the radiated light from the surface of said substrate, the intensity being measured in said step (c), wherein
    in said step (c), a plurality of intensities of the radiated light from the surface of said substrate are measured in chronological order after the irradiation in said step (b) is stopped, and
    in said step (d), an exponentially approximate equation approximated by least square method indicating changes in time of the intensity of the radiated light is obtained from said plurality of intensities of the radiated light measured in chronological order in said step (c), to thereby calculate a maximum temperature reached by the surface of said substrate from said exponentially approximate equation, said equation being in the form of $f(t-a)=b^t+c$, wherein "t" represents time and "a", "b", "c", are coefficients determined so as to obtain a smallest sum of square of differences between levels of output signals $V_1, V_2, V_3, \ldots V_n$, at times of measurement t21, t22, t23, ... tn, respectively, and $f(t-a)$; and
    using said calculating step (d) to control said flash lamps to activate implanted impurities in said substrate to join metal and silicon, or to crystalize polysilicon, or to recover crystal defects caused by the implanted impurities.

2. The method according to claim 1, wherein
    in said step (c), said plurality of intensities of the radiated light are measured until the temperature of the surface of said substrate decreases to the temperature near the preheating temperature in said step (a).

* * * * *